United States Patent [19]

Takahama

[11] Patent Number: 4,677,741
[45] Date of Patent: Jul. 7, 1987

[54] METHOD OF MANUFACTURING PACKAGE FOR HIGH POWER INTEGRATED CIRCUIT

[75] Inventor: Shinobu Takahama, Itami, Japan

[73] Assignee: Mitsubishi Denki Kabushiki Kaisha, Tokyo, Japan

[21] Appl. No.: 884,293

[22] Filed: Jul. 10, 1986

Related U.S. Application Data

[62] Division of Ser. No. 442,747, Nov. 18, 1982, abandoned.

[30] Foreign Application Priority Data

Nov. 30, 1981 [JP] Japan ............................. 56-194687

[51] Int. Cl.⁴ ............................................ H01L 21/56
[52] U.S. Cl. ............................. 29/588; 29/589; 29/840; 29/843; 29/832; 357/74; 357/80; 357/71; 357/81
[58] Field of Search .............. 29/588, 589, 840, 843, 29/832; 357/74, 80, 71, 81

[56] References Cited

U.S. PATENT DOCUMENTS

| | | | |
|---|---|---|---|
| 2,921,245 | 1/1960 | Wallace Jr. et al. | 357/74 |
| 3,141,226 | 7/1964 | Bender et al. | 357/74 |
| 3,223,903 | 12/1965 | Soloman | 357/74 |
| 3,241,011 | 3/1966 | Mille et al. | 357/74 |
| 3,729,820 | 5/1973 | Ihochi et al. | 357/80 |
| 3,908,185 | 9/1975 | Martin | 357/74 |
| 3,964,155 | 6/1976 | Leinkram et al. | 357/81 |
| 4,067,040 | 1/1978 | Tsuzuki et al. | 357/74 |
| 4,176,443 | 12/1979 | Iannuzzi et al. | 357/71 X |
| 4,445,274 | 5/1984 | Suzuki et al. | 357/80 |

FOREIGN PATENT DOCUMENTS

| | | | |
|---|---|---|---|
| 0036468 | 4/1978 | Japan | 357/74 B |
| 0050269 | 4/1979 | Japan | 357/67 R |
| 0140468 | 10/1979 | Japan | 357/74 B |
| 0068661 | 5/1980 | Japan | 357/80 |

Primary Examiner—Brian E. Hearn
Assistant Examiner—Beverly A. Pawlikowski
Attorney, Agent, or Firm—Lowe, Price, Leblanc, Becker & Shur

[57] ABSTRACT

A semiconductor device is provided within an outer container (21) made of a ceramic which is of a box shape having an opening in an upper portion thereof and a bottom plate and also having a stepped portion (21a) at the position in an intermediate height of an inner wall of side plates. A metalized layer (22) is deposited in inner and outer surfaces of the bottom plate and a surface of the stepped portion. A metal plate (30) is brazed by a silver solder (26) on the metalized layer of the outer surface of the bottom plate and at the same time, a common metal substrate (27) is also brazed by a silver solder (26) on the metalized layer (22) on the inner surface of the bottom plate. A plurality of external electrodes (23, 23', 24, 25) in a frame shape of a conductor plate are connected to the metalized layer (22) of the surface of the stepped portion (21a) by a silver solder (26). A heat sink plate (10) is connected to the common metal substrate (27) by means of soldering (6) and a semiconductor chip (7, 28) is soldered on the heat sink plate (10). After a semiconductor chip (7, 28) is electrically connected to the plurality of electrodes (23, 23', 24, 25) and the metal plate (30), the container (21) is filled with a soft resin (12) for sealing.

2 Claims, 3 Drawing Figures

METHOD OF MANUFACTURING PACKAGE FOR HIGH POWER INTEGRATED CIRCUIT

This application is a division of application Ser. No. 442,747, filed Nov. 18, 1982 now abandoned.

BACKGROUND OF THE INVENTION

1. Field of the Invention

The present invention relates to a semiconductor device and a method for manufacturing the same. More particularly, the present invention relates to a semiconductor module for a large power.

2. Description of the Prior Art

With the advancement of the technology of surface protection and resign sealing of a semiconductor chip, it became possible to miniaturize and simplify a semiconductor module for a large power, to enhance an insulating capability and to perform a composite integration of many functions and low cost of the semiconductor module. Although only about two years has passed since advent of such a semiconductor module for a large power, the module rapidly comes to be utilized in various fields.

FIG. 1 is a cross sectional view of a conventional semiconductor module for a large power. A tube 2 in rectangular section constituting a side portion of an outer container is fixed to a metal plate 1 for radiation by an adhesive material 3 such as an adhesive or an adhesive tape and is formed of a relatively low heat-proof resin for injection molding, such as PBT group resin, PPS group resin and phenol group resin and the like. A bed 4 for external electrodes, which is made of an insulating material, is fixed onto the metal plate 1 for radiation by an adhesive 3. External electrodes 5 are connected onto the underframe 4 by a soldering material 6. An alumina ceramic plate 8 on both sides of which metalized layers 9 are printed is connected onto the metal plate 1 for radiation by the soldering material 6. The alumina ceramic plate 8 insulates a power semiconductor chip 7 and effectively transfers a heat to the metal plate 1 for radiation. A heat sink plate 10 is connected onto the alumina ceramic plate 8 by the solder material 6 and a semiconductor chip 7 is connected to an upper surface of the heat sink plate 10. Aluminum leads 11 connect a semiconductor chip 7 to the external electrodes 5. The tube 2 is filled with a sealing resin 12 so that a semiconductor chip 7 is insulated and sealed and a mechanical stress applied to the aluminum leads 11 is reduced. The sealing resin may be a soft silicone group resin. A resin 13 for protection is applied on the sealing resin 12 so that the external electrodes 5 are fixed and protected from a mechanical action from the exterior. The resin 13 for protection may be a relatively hard epoxy group resin.

As described in the foregoing, a conventional apparatus is adapted such that the tube 2 and the bed 4 for exterior electrodes are separately adhered or soldered to the metal plate 1 for radiation, and hence the positioning and attachment of the respective parts take much time and also there are some problems about the respective adhesion and soldering. Particularly, since the outer container 2 is made from a synthetic resin and thus a brazing junction to the metal plate 1 for radiation is impossible, the container 2 is adhered to the plate 1 by an adhesive. In addition, the container 2 has a relatively large size and a complicated shape and hence a deformation due to thermal shrinkage occurs with ease. For this reason, a moisture from an exterior often penetrates into an interior from the adhered portion. For example, in a test in which a semiconductor device soaks in water of 2 kg/cm$^2$ at 125° C., which is one of acceleration tests for water immersion, the defect that deterioration of the semiconductor chip 7 and lowering of dielectric strength are caused within 50 to 100 hours is revealed.

SUMMARY OF THE INVENTION

The present invention is directed to a structure of a large power semiconductor module. A semiconductor device in accordance with the present invention includes an outer container of ceramic material which is of a box shaped type having an opening in an upper portion and a bottom plate and also having a stepped portion in an intermediate position of an internal wall of side plates; a plurality of external electrodes in a frame shape of a conductor plate fixed onto the surface of the stepped portion; a metal plate fixed onto an outer surface of the bottom plate of the outer container; a semiconductor device fixed onto an inner surface of the bottom plate of the outer container and electrically connected to the plurality of external electrodes and the metal plate; and a soft sealing resin which the outer container is filled with.

In a preferred embodiment of the present invention, a metalized layer is formed on the inner and outer surfaces of the bottom plate and the surface of the stepped portion of the outer container so that the plurality of external electrodes and the semiconductor device are fixed to the metalized layer by a hard soldering. The semiconductor device includes a common metal substrate brazed to the metalized layer on the inner surface of the bottom plate of the outer container by a hard solder, a heat sink plate brazed onto the common metal substrate by a soft solder and a semiconductor chip brazed onto the heat sink plate by a soft solder. Brazing by a hard solder preferably includes brazing by a silver solder and the brazing by a soft solder preferably includes a soldering.

Accordingly, a principal object of the present invention is to provide a semiconductor apparatus and a method for manufacturing the same wherein the positioning and attachment of electrodes are readily achieved.

Another object of the present invention is to provide a semiconductor apparatus and a method for manufacturing the same wherein a water immersion from an exterior can be prevented so that deterioration of a semiconductor chip and lowering of dielectric strength can be minimized.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
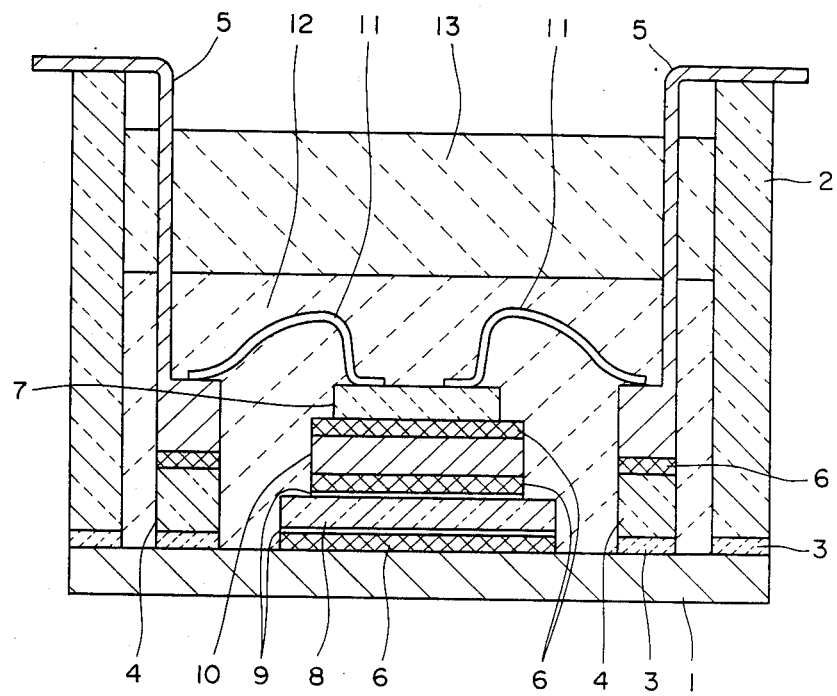
FIG. 1 is a cross sectional view of a conventional large power semiconductor module.
Figure 2:
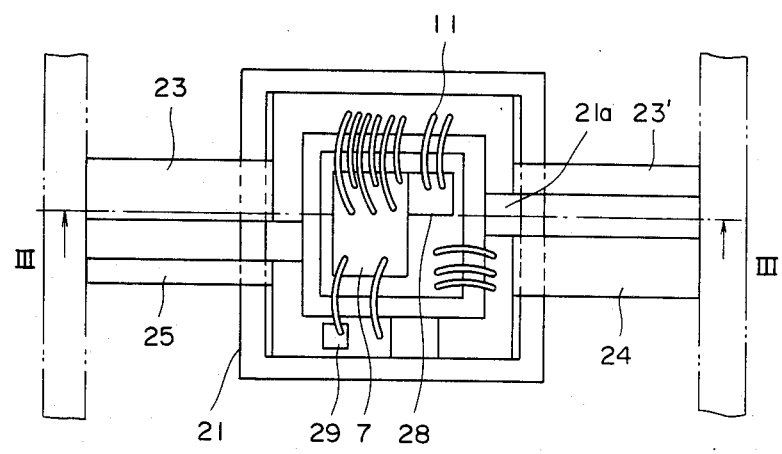
FIGS. 2 and 3 are a plan view and a cross sectional view, respectively, of a large power semiconductor module of a preferred embodiment of the present invention.
Figure 3:
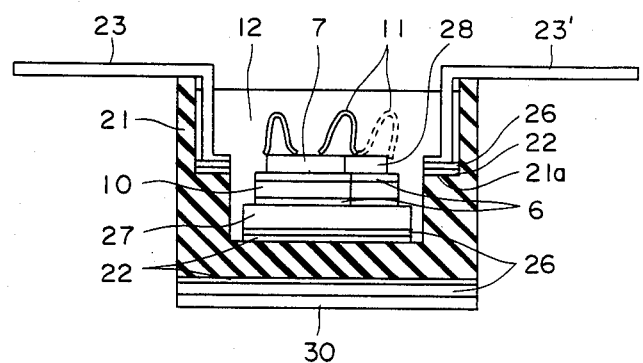

FIGS. 2 and 3 are a plan view and a cross sectional view, respectively, of a large power semiconductor module showing a semiconductor apparatus of a preferred embodiment of the present invention. Portions indicated by reference numerals 6, 7 and 10 through 12 are the same as the portions indicated by the same reference numerals in the above described conventional apparatus. A ceramic outer container 21 made of an alumina ceramic material have a bottom plate and an opening in an upper portion thereof and is formed with a stepped portion 21a at an intermediate position in an inner wall. Metalized layers 22 are provided on the surface of the stepped portion 21a of the outer container 21 and inner and outer surfaces of the bottom plate of the container 21. A plurality of external electrodes 23 to 25 made of a nickel plated copper plate and formed in a frame-like manner are brazed, at the bottom portion thereof, to the stepped portion 21a through the metalized layer 22 by a silver solder 26. After the series of frames as indicated by a chain line are punched by a press, edge portions indicated by the chain line are cut so that a single electrode is separated from each other. Although the top portions of the external electrodes 23 to 25 are curled in the horizontal direction in this embodiment, they may be upright in an upper direction.

A common metal substrate 27 of a nickel plated copper plate is brazed by a silver solder onto the upper surface of the bottom of the outer container 21 through the metalized layer 22. A heat sink plate 10 is disposed on the common metal substrate 27 through a soldering material 6. A power semiconductor chip 7 and a diode chip 28 for a return current are disposed on the heat sink plate 10 through a soldering material 6. A further diode chip 29 for a speedup is disposed on the bottom of the external electrodes 25 through the soldering material 6. Each of the above described parts is soldered by a heating process. Each of the semiconductor chips 7, 28 and 29 is wire-bonded to a corresponding part by each of aluminum lines 11. A metal plate 30 of a nickel plated copper plate is brazed by a silver solder 26 onto the outer surface of the bottom of the ceramic outer container 21 through the metalized layer 22, so that the whole semiconductor apparatus can be easily soldered and fixed to other radiator and a fin for radiation. The metal plate 30 also serves as an electrode of the semiconductor. After wire bonding, the outer container 21 is filled with a sealing resin 12 so that the container 21 is completely sealed.

A semiconductor apparatus of one embodiment as structured in the foregoing eliminates the defects of the conventional apparatus and has many advantages in the following.

1. Since a conductor plate frame is used as external electrodes, an alignment of the electrodes with the ceramic outer container can be simply and easily achieved. In addition, the external electrodes are brazed by a silver solder to the ceramic outer container, there is no fear that the silver solder is re-melted at the time of soldering of semiconductor chips in the course of assembly, and hence the external electrodes can be perfectly fixed to the outer container.

2. Since an outer container in a box shape having an opening in the upper portion and a bottom plate is employed, immersion of moisture is entirely eliminated and hence an evaluation in a PCT test can be largely improved.

3. Since a stepped portion is provided in an inner wall of an outer container, external electrodes which are fixed, at the bottom portion thereof, to the surface of the stepped portion by a silver solder brazing and which a large electric current flows into, are directly connected to aluminum lines by a supersonic bonding. Thus, only a filling of a soft silicone mechanical protection of the aluminum lines makes it possible to protect sufficiently the aluminum lines to a mechanical stress transmitted from the side surface of the outer container and the external electrodes, which eliminates filling of a hard epoxy group resin on a filled soft silicone resin.

4. Since all of the parts are assembled within a ceramic outer container in a box shape, an operation for mutual alignments with other parts becomes simple and mass production becomes easy.

5. Since a metal plate and a common metal substrate are brazed by a hard solder onto outer and inner surfaces of a bottom of a box shaped outer container respectively at the same time, a mechanical stress applied to the outer container at the time of brazing (mainly, due to a difference of a thermal expansion) can be reduced.

6. Since external electrodes are fixed to the surface of a stepped portion provided in an inner wall of an outer container, a lower portion which is under the stepped portion becomes an insulating region. Accordingly, an insulating distance between semiconductor chips and external electrodes is increased to a vertical direction and hence it becomes possible to reduce a horizontal distance so that a whole apparatus can be miniaturized.

As described in the foregoing, according to a semiconductor apparatus of the present invention wherein there is provided a ceramic outer container having an opening in the upper portion thereof and a bottom plate and also having a stepped portion at the position of an intermediate height in an inner surface of the container, and external electrodes of a conductor plate frame are brazed by a hard solder onto a surface of the above described stepped portion, an assembly operation is made easy and simplified, a low cost and mass production become possible and an immersion of a moisture from an exterior can be prevented so that a reliability is enhanced. Furthermore, since a metal plate is brazed by a hard solder onto an outer surface of a bottom of an outer container, a whole apparatus can be easily fixed to other radiator and the like by a soft solder brazing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor apparatus comprising the steps of:
    preparing ceramic outer container in a box shape having an opening in an upper portion thereof and a bottom plate and also having a stepped portion at the position of an intermediate height of an inner wall thereof,
    forming metalized layers on inner and outer surfaces of said bottom plate and the surface of said stepped portion,
    brazing by a hard solder a common metal substrate onto the metalized layer on the inner surface of said bottom plate simultaneously with brazing by a hard solder a metal plate onto the metalized layer of the outer surface of said bottom plate, brazing by a hard solder a plurality of external electrodes of a conductor plate frame shape on the metalized layer on the surface of said stepped portion, brazing by a soft solder a heat sink plate on said common metal substrate, brazing by a soft solder a semiconductor chip on said heat sink plate, electrically connecting said semiconductor chip to said metal plate and said external electrodes, and filling a soft sealing resin in said outer container.

2. A method for manufacturing a semiconductor apparatus in accordance with claim 1, wherein said hard solder brazing includes a silver solder brazing and said soft solder brazing includes a soldering.

* * * * *

UNITED STATES PATENT AND TRADEMARK OFFICE
CERTIFICATE OF CORRECTION

PATENT NO. : 4,677,741

DATED : July 7, 1987

INVENTOR(S) : Shinobu Takahama

It is certified that error appears in the above-identified patent and that said Letters Patent is hereby corrected as shown below:

```
          Title page (30) should read
--  [30]      Foreign Application Priority Data
    Nov. 30, 1981 [JP]   Japan .............. 56-194698 --
```

Signed and Sealed this

Eighth Day of December, 1987

Attest:

DONALD J. QUIGG

*Attesting Officer*        *Commissioner of Patents and Trademarks*